United States Patent
Steffan et al.

(10) Patent No.: US 6,272,393 B1
(45) Date of Patent: Aug. 7, 2001

(54) EFFICIENT TOOL UTILIZATION USING PREVIOUS SCAN DATA

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/161,878

(22) Filed: Sep. 28, 1998

(51) Int. Cl.$^7$ .................................................. G06F 19/00
(52) U.S. Cl. ............................................ 700/121; 700/101
(58) Field of Search ............................. 700/121, 110, 700/101, 109; 716/21, 19; 438/14, 25; 324/751

(56) References Cited

U.S. PATENT DOCUMENTS

| | | | |
|---|---|---|---|
| 5,479,252 | * | 12/1995 | Worster et al. ............... 356/237 |
| 5,777,901 | * | 7/1998 | Berezin et al. .................. 716/19 |
| 5,862,055 | * | 1/1999 | Chen et al. ..................... 700/110 |
| 5,982,920 | * | 11/1999 | Tobin, Jr. et al. .............. 382/145 |
| 6,011,619 | * | 1/2000 | Steffan et al. ............... 356/237.3 |
| 6,096,093 | * | 8/2000 | Caywood et al. ................ 716/21 |

* cited by examiner

*Primary Examiner*—William Grant
*Assistant Examiner*—Kidest Bahta
(74) *Attorney, Agent, or Firm*—A. Donald Nelson

(57) ABSTRACT

A method of manufacturing a semiconductor device including selecting at least one die on at least one wafer in a manufacturing lot of wafers to scan and inspect, processing the wafers through a first process, mapping detected defects with the at least one die selected to be scanned and inspected and determining if the selected at least one die should be scanned and inspected in the next process. If it is determined that the selected at least one die should not be scanned and inspected in the next process, at least one alternative die is selected to be scanned and inspected in the next process.

5 Claims, 2 Drawing Sheets

EFFICIENT TOOL UTILIZATION USING PREVIOUS SCAN DATA

BACKGROUND OF THE INVENTION

1. Field of the Invention

This invention relates generally to the manufacture of high performance semiconductor integrated devices. More specifically, this invention relates to the process quality control utilized during the manufacture of high performance semiconductor integrated devices. Even more specifically, this invention relates to a process quality control that uses previous scan data to more efficiently utilize quality control equipment.

2. Discussion of the Related Art

In the manufacture of high performance semiconductor integrated devices there are several tradeoffs that must be made. One of the tradeoffs is the tradeoff between tight control of process quality control and high volume production. As can be appreciated, inspecting every device on every wafer after each process step would effect the highest quality control. However, as can also be appreciated, the inspection of every device on every wafer after each process step would be highly detrimental to the goal of high volume production. The typical tradeoff is to perform inspections of random samples selected after various steps throughout the entire manufacturing process.

A typical tradeoff in a quality control process is to select one or more wafers from each manufacturing lot. A manufacturing lot is typically the number of wafers in a cassette and the typical cassette contains about 24–25 wafers. As the size of wafers increases and as the number of die on each wafer increases, the time required for scanning and inspecting each die on the selected wafer or wafers also increases. In addition, as the size of each die shrinks, the number and kind of defects that can affect the operation of the die have also increased. The increase in the number and kind of defects that must be detected and classified has also increased the time required for scanning and inspecting each die on the selected wafer or wafers. The increase in time and complexity of the quality control process is better understood when it is realized that a typical production cycle of product wafers, the selected wafers may be scanned as many as 40 times or more during a typical manufacturing process.

The scanned data is usually saved to a relational database for further post-inspection review and/or evaluation, but unfortunately, the results of previous scans of the current wafer being processed are usually not available to the tool doing the current scan or to the operator monitoring the current scan. The scanned data includes many defect classifications and defect data, including defective die levels, defect sizing data and types of defects, which could lead to using a different type of scan or even rejecting the proposed wafer in lieu of another wafer from the same lot which might be more indicative of the current process trend.

Therefore, what is needed is a quality control process that reviews previous scan data, both for previous lots and for the current lot, and that uses that scan data to optimize equipment performance.

SUMMARY OF THE INVENTION

The present invention overcomes the above problems of the prior art semiconductor manufacturing process and provides additional advantages through a method of manufacturing semiconductor devices in which previous scan data is utilized to determine if a selected die to be scanned and inspected on a selected wafer is to be scanned and inspected in the next process.

In accordance with one aspect of the invention, an alternate die on the selected wafer is selected to be scanned and inspected after the next process is completed.

In accordance with another aspect of the invention, the previous scan data, a number of allowable defects and classification for the previously detected defects are part of a determination algorithm utilized to determine whether the selected die to be scanned and inspected is to be scanned and inspected after the next process is completed.

The described method of manufacturing a semiconductor device provides a method in which scan data for each process is mapped to selected die. The method includes selecting alternate die to scan and inspect if the current selected die have been "killed" or which have cluster defects such as scratches. The selection of alternate die to scan and inspect provides a more efficient utilization of scanning tools.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention, which illustrates the best mode presently contemplated by the inventors for practicing the invention.

Figure 1:
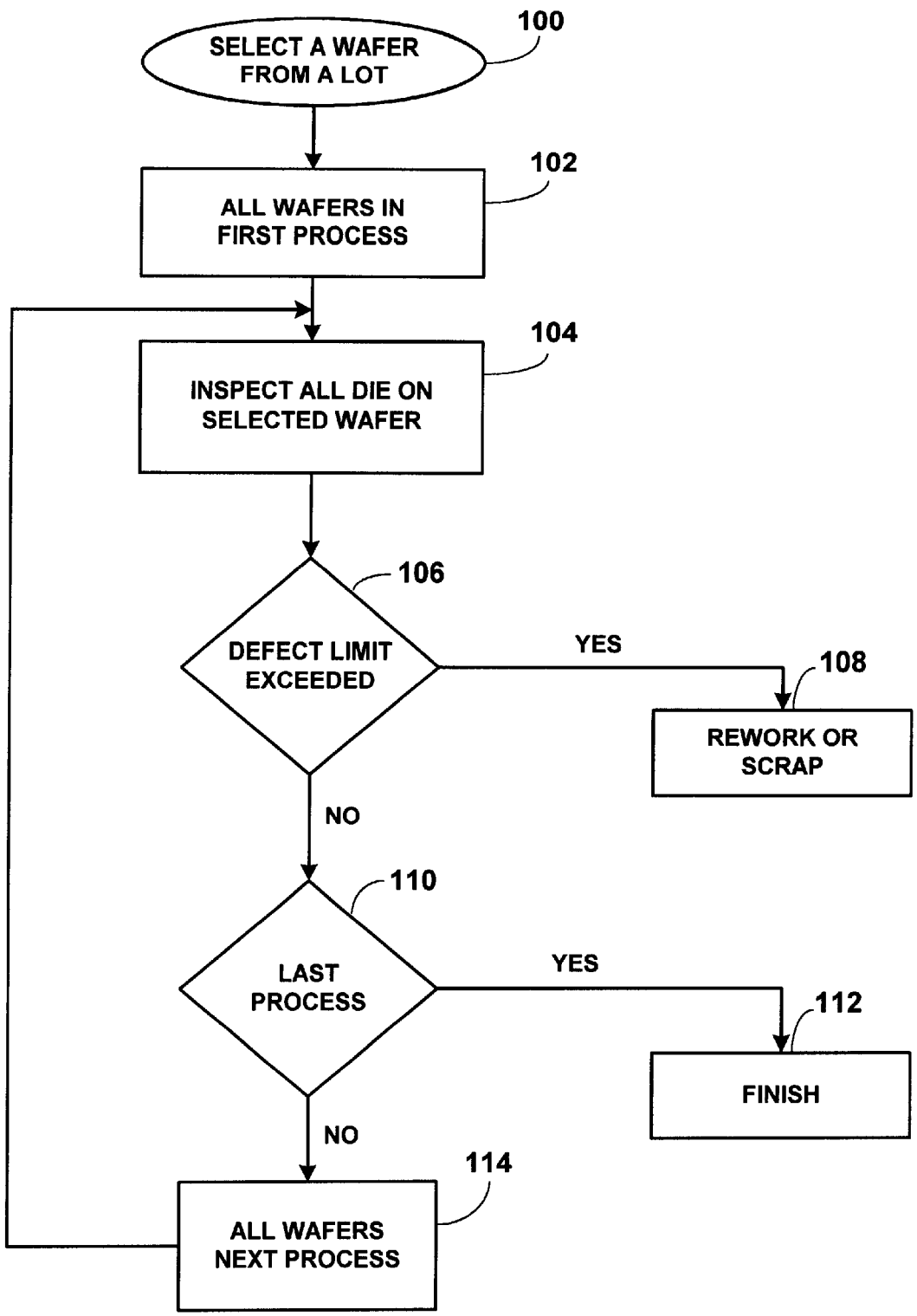
FIG. 1 is a flow diagram of a typical prior art manufacturing process for the manufacture of semiconductor devices.

FIG. 1 is a flow diagram of a typical prior art process for the manufacturing of high performance integrated devices. The process begins by selecting a wafer or wafer from a manufacturing lot at 100. As is known in the semiconductor manufacturing art, a manufacturing lot is determined by the number of wafers in a cassette. The number of wafers in a cassette is typically 24–25 wafers. A cassette is a wafer holder that holds wafers as the wafers are moved from process-to-process. The cassette holding the wafers including the selected wafer or wafers to be inspected is loaded into the first process tool at 102.

After the first process is finished, all of the die on the selected wafer or wafers are scanned and inspected at 104. At 106, a determination is made as to whether a defect limit has been exceeded. The defect limit is an arbitrary limit set by the system operators and includes statistical parameters that would indicate that the wafers not scanned and inspected would have the same type and number of defects and that if the process is continued the lot would have a yield below a profitable level. If the number of defects on the inspected wafer exceeds the defect limit, the manufacturing lot is either reworked or scrapped at 108 and at the very least evaluated to determine the cause of the excessive number of defects. If the number of defects on the inspected wafer does not exceed the defect limit, it is determined at 110 if the process just conducted is the last process.

If the process just conducted is the last process the manufacturing lot is finished, as indicated at 112. If the process just conducted is not the last process, the manufacturing lot is sent to the next process, indicated at 114. After the next process is completed, the selected wafer or wafers is or are scanned and inspected, at 104. This process flow repeats until all of the processes have been completed.

Figure 2:
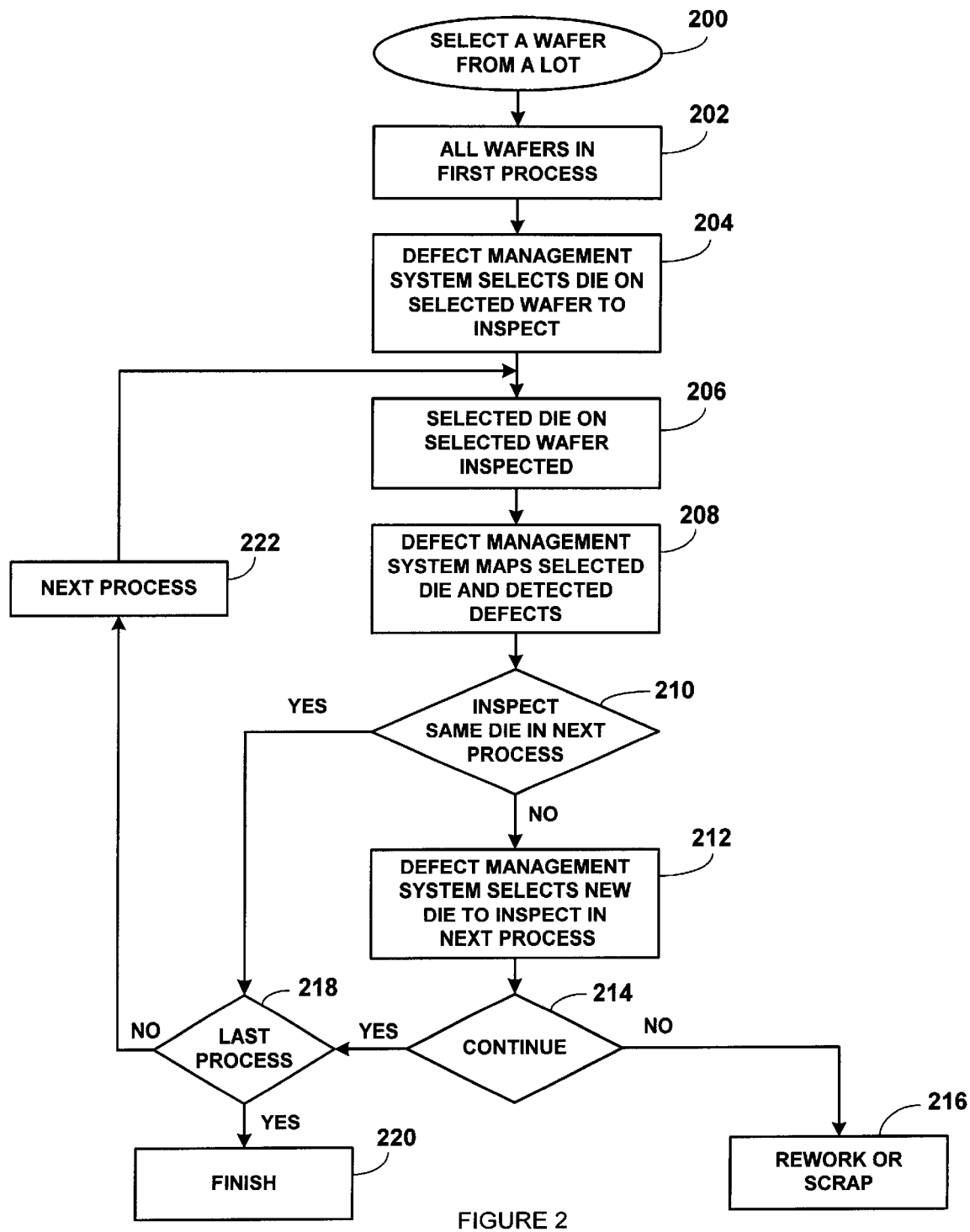
FIG. 2 is a flow diagram of a manufacturing process in accordance with the present invention.

FIG. 2 is a flow diagram of a process for the manufacturing of high performance integrated devices in accordance with the present invention. The process begins by selecting a wafer or wafer from a manufacturing lot at 200 that will be subjected to scanning and inspection after selected processes. It is noted that the wafers are not scanned after each and every process. As is known in the semiconductor manufacturing art, some processes do not typically cause defects on the wafer. Such non-defect causing processes include such processes such as washing or cleaning or a thermal process such as a rapid thermal anneal (RTA) process. The cassette holding the wafers, including the selected wafer or wafers to be scanned and inspected is loaded into the first process tool at 202.

After the first process is finished, a defect management system selects a number of die to scan and inspect on the wafer or wafers to be scanned and inspected, as indicated at 204. The selected die on the selected wafer or wafers are scanned and inspected, as indicated at 206. The defects identified at 206 are mapped by the defect management system in relation to the selected die at 208. A determination is made by the defect management system at 210 whether the same die will be scanned and inspected in the next process. The determination is made by an algorithm that includes a determination if there are too many defects on the selected die where the number of defects that is too many is an arbitrary number that is selected by a system administrator. The algorithm also includes classification data such as type of defect and whether the type of defect will cause the die to fail or whether the type of defect is a killer defect If it is determined at 210 that some of the selected die are not to be inspected in subsequent processes, the defect management system, at 212, selects a new die or new die to be inspected in subsequent processes. The defect management system then determines at 214 if the process should continue. The determination at 214 considers questions such as whether there are further die to inspect and whether the inspected die indicate that the yield of the lot would be lower than acceptable for the lot to be profitable for the manufacturer. If it is determined at 214 that the process should not continue, the lot is reworked or scrapped as indicated at 216. If it is determined at 214 that the lot should be processed further it is then determined at 218 whether the process just conducted is the last process. If it is determined that the process just conducted is the last process, the lot is finished as indicated at 220. If it is determined that the process just conducted is not the last process, the lot is sent to the next process as indicated at 222.

In summary, the results and advantages of the method of the present invention can now be more fully realized. The quality control process of the present invention provides a method in which scan data for each process is mapped to selected die. The method includes selecting alternate die to scan and inspect if the current selected die have been "killed" or which have cluster defects, such as scratches, since obtaining further scanning information on die which have these types of defects only bogs down the system. The bogging down of the scanning system by the high-density defective die manifestly reducing the efficiency of the manufacturing process. The defect management system generates a wafer map having a graphical representation of previous defect data. The defect management system or the system administrator would then select the next step from a variety of options, including skipping the defective die.

The benefits of the present invention are:
1. Improved efficiency of the scanning tools;
2. Improved accuracy of the information collected; and
3. Improved process monitoring capability.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor devices in which previous scan data is utilized to determine if a selected die to be scanned and inspected on a selected wafer is to be scanned and inspected in the next process, the method comprising:

selecting at least one wafer to scan and inspect in a manufacturing lot of wafers;

processing the manufacturing lot of wafers in a first process;

selecting at least one die on the at least one wafer to scan and inspect, wherein the selection of the at least one die is based on previous scan data stored in a defect management system;

scanning and inspecting the selected at least one die;

mapping defects detected on the at least one selected die, wherein the mapping is done by the defect management system; and determining if the at least one selected die is to be scanned and inspected after a next process is completed, wherein the determination is made by the defect management system based upon predetermined questions.

2. The method of claim 1 further comprising selecting an alternate die on the at least one wafer to scan and inspect if it is determined that the at least one selected die on the at least one wafer should not be scanned and inspected in the next process.

3. The method of claim 2 further comprising determining if a process just completed is the last process.

4. The method of claim 3 further comprising sending the manufacturing lot to the next process if it is determined that the process just completed is not the last process.

5. The method of claim 4 wherein the step of determining if the at least one die on the at least one wafer is to be inspected after a next process is completed is accomplished by a decision algorithm that includes previous scan data, a number of allowable defects and classification information for the previously detected defects.

* * * * *